US010854589B2

(12) United States Patent
Sugita et al.

(10) Patent No.: US 10,854,589 B2
(45) Date of Patent: Dec. 1, 2020

(54) SEMICONDUCTOR DEVICE

(71) Applicant: DENSO CORPORATION, Kariya (JP)

(72) Inventors: Satoru Sugita, Kariya (JP); Ryota Tanabe, Kariya (JP); Shunsuke Arai, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/507,240

(22) Filed: Jul. 10, 2019

(65) Prior Publication Data

US 2019/0333909 A1 Oct. 31, 2019

Related U.S. Application Data

(63) Continuation of application No. PCT/JP2017/040519, filed on Nov. 10, 2017.

(30) Foreign Application Priority Data

Jan. 18, 2017 (JP) ................. 2017-006938

(51) Int. Cl.
| | |
|---|---|
| *H01L 25/18* | (2006.01) |
| *H01L 23/31* | (2006.01) |
| *H01L 23/367* | (2006.01) |
| *H01L 23/473* | (2006.01) |
| *H01L 29/417* | (2006.01) |
| *H02M 7/537* | (2006.01) |

(52) U.S. Cl.
CPC .......... *H01L 25/18* (2013.01); *H01L 23/3142* (2013.01); *H01L 23/367* (2013.01); *H01L 23/473* (2013.01); *H01L 29/41708* (2013.01); *H02M 7/537* (2013.01)

(58) Field of Classification Search
CPC combination set(s) only.
See application file for complete search history.

(56) References Cited

U.S. PATENT DOCUMENTS

| | | |
|---|---|---|
| 2007/0018197 A1 | 1/2007 | Mochida et al. |
| 2009/0201708 A1 | 8/2009 | Ohkouchi et al. |
| 2012/0256194 A1* | 10/2012 | Yoshihara ............ H01L 23/645 257/77 |
| 2014/0035112 A1 | 2/2014 | Kadoguchi et al. |

(Continued)

FOREIGN PATENT DOCUMENTS

JP  2016-004941 A  1/2016

*Primary Examiner* — Zandra V Smith
*Assistant Examiner* — Andre C Stevenson
(74) *Attorney, Agent, or Firm* — Posz Law Group, PLC

(57) ABSTRACT

A semiconductor device includes a first semiconductor module and a second semiconductor module. The first semiconductor module configures an upper arm, and includes first semiconductor elements connected in parallel to each other, a sealing resin body, and a positive electrode terminal. The second semiconductor module configures a lower arm, and includes second semiconductor elements connected in parallel to each other, a sealing resin body, and a negative electrode terminal. The first and second semiconductor modules are aligned in an alignment direction. At least one of the first and second semiconductor modules has a relay terminal for electrically relaying electrodes on a low potential side of the first semiconductor elements and electrodes on a high potential side of the second semiconductor elements.

6 Claims, 11 Drawing Sheets

(56) References Cited

U.S. PATENT DOCUMENTS

2014/0118934 A1 5/2014 Tokuyama et al.
2016/0007492 A1 1/2016 Suwa et al.
2016/0133597 A1 5/2016 Kouno

* cited by examiner

Y DIRECTION

X DIRECTION

SEMICONDUCTOR DEVICE

CROSS REFERENCE TO RELATED APPLICATIONS

The present application is a continuation application of International Patent Application No. PCT/JP2017/040519 filed on Nov. 10, 2017, which designated the U.S. and claims the benefit of priority from Japanese Patent Application No. 2017-6938 filed on Jan. 18, 2017. The entire disclosures of all of the above applications are incorporated herein by reference.

TECHNICAL FIELD

The present disclosure relates to a semiconductor device which configures an upper and lower arm and is to be arranged with a cooler in a stacked manner so as to be cooled.

BACKGROUND

A semiconductor device which configures an upper and lower arm may be arranged with a cooler in a stacked manner so as to be cooled. In such a semiconductor device, one semiconductor element (semiconductor chip) configuring the upper arm and the other semiconductor element (semiconductor chip) configuring the lower arm are integrally sealed by a sealing resin body. Thus, the semiconductor device has a 2-in-1 package structure configuring the upper and lower arm for one phase.

Such a semiconductor device may include, as main terminals for external connection, a positive electrode terminal (high potential power supply terminal) that is electrically connected to an electrode on a high potential side of the semiconductor element configuring the upper arm, a negative electrode terminal (low potential power supply terminal) that is electrically connected to an electrode on a low potential side of the semiconductor element configuring the lower arm, and an output terminal to a motor.

SUMMARY

The present disclosure describes a semiconductor device including a first semiconductor module and a second semiconductor module. The first semiconductor module configures an upper arm, and includes a plurality of first semiconductor elements connected in parallel to each other, a sealing resin body, and a positive electrode terminal. The second semiconductor module configures a lower arm, and includes a plurality of second semiconductor elements connected in parallel to each other, a sealing resin body, and a negative electrode terminal. The first and second semiconductor modules are aligned in an alignment direction. At least one of the first and second semiconductor modules has a relay terminal for electrically relaying electrodes on a low potential side of the first semiconductor elements and electrodes on a high potential side of the second semiconductor elements.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
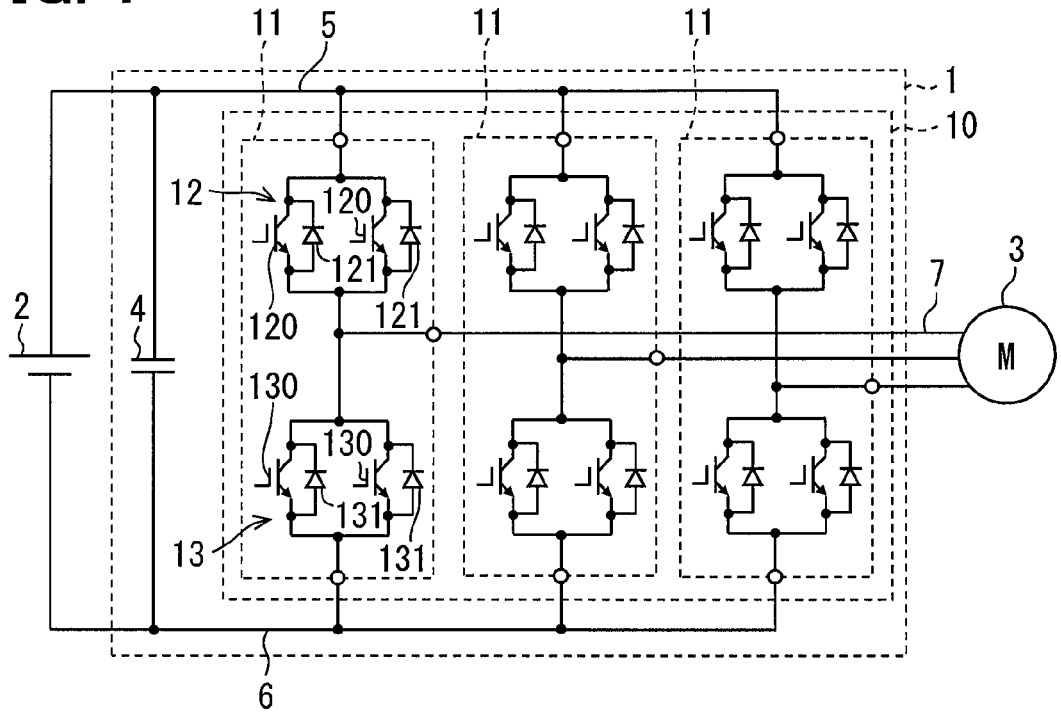
FIG. 1 is an equivalent circuit diagram showing a power conversion device employing a semiconductor device according to a first embodiment.

In the application of a semiconductor device to a power control, there is a demand to obtain a large current capacity (output). For example, a configuration in which the semiconductor elements of respective arms are connected in parallel to each other may be employed.

When a parallel connection structure is to be realized by the semiconductor device having the 2-in-1 package structure (hereinafter referred to as a semiconductor module), two semiconductor modules are prepared. Further, the respective positive electrode terminals, the respective negative electrode terminals, and the respective output terminals are electrically connected to each other through bus bars which are each formed of a metal plate. Therefore, the number of terminals, and consequently connection points of the terminals increase. In the above case, the number of terminals is six, and the number of connection points is six.

In regard to a body size of the power module in which the semiconductor modules are disposed on the coolers in a stacked manner, two semiconductor modules may have to be arrayed side by side in a direction orthogonal to a stacking direction because of a relationship of an aspect ratio between a length in the stacking direction and a length in the direction orthogonal to the stacking direction, that is, because of a mounting constraint. In such a case, if the above configuration is adopted, a bus bar structure becomes complicated and an inductance increases.

According to an aspect of the present disclosure, a semiconductor device which configures an upper and lower arm and is to be stacked on a cooler so as to be cooled, includes a first semiconductor module and a second semiconductor module.

The first semiconductor module configures an upper arm, and includes a plurality of first semiconductor elements connected in parallel to each other, a first resin body integrally sealing the plurality of first semiconductor elements, and a positive electrode terminal electrically connected to electrodes of the first semiconductor elements on a high potential side and protruding from the first resin body.

The second semiconductor module configures a lower arm, and includes a plurality of second semiconductor elements connected in parallel to each other, a second resin body integrally sealing the plurality of second semiconductor elements, and a negative electrode terminal electrically connected to electrodes of the second semiconductor elements on a low potential side and protruding from the second resin body. The first semiconductor module and the second semiconductor module are aligned in a direction orthogonal to a stacking direction.

At least one of the first semiconductor module and the second semiconductor module has a relay terminal that electrically relays electrodes of the first semiconductor elements on the low potential side and electrodes of the second semiconductor elements on the high potential side.

According to the above semiconductor device, in the first semiconductor module, the plurality of first semiconductor elements configuring the upper arm are connected in parallel with each other, and in the second semiconductor module, the plurality of second semiconductor elements configuring the lower arm are connected in parallel with each other. In this manner, the first semiconductor elements configuring the upper arm are collectively disposed in the first semiconductor module, and the second semiconductor elements configuring the lower arm are collectively disposed in the second semiconductor module. For that reason, for example, the positive electrode terminal may be provided only to the first semiconductor module, and the negative electrode terminal may be provided only to the second semiconductor module. Therefore, the number of terminals and also the number of connection points can be reduced.

As described above, only the first semiconductor module may have the positive electrode terminal and only the second semiconductor module may have the negative electrode terminal. For that reason, between the two semiconductor modules, it is not necessary to respectively connect positive electrode terminals to each other and negative electrode terminals to each other through bus bars. Therefore, the bus bar structure can be simplified and the inductance can be reduced.

Multiple embodiments will be further described with reference to the drawings. In the multiple embodiments, functionally and/or structurally corresponding parts are denoted by the same reference numerals. In the following description, a stacking direction of the semiconductor device and the cooler is indicated by a Z-direction, and an alignment direction of two semiconductor modules which is orthogonal to the Z-direction is indicated by an X-direction. A direction orthogonal to both the Z-direction and the X-direction is denoted as a Y-direction. Unless otherwise specified, a shape along an XY plane defined by the X-direction and the Y-direction is a planar shape.

First Embodiment

First, a power conversion device to which a semiconductor device is applied will be described with reference to FIG. 1.

A power conversion device 1 shown in FIG. 1 is mounted on, for example, an electric vehicle or a hybrid vehicle. The power conversion device 1 is configured to convert a DC voltage supplied from a battery 2, which is a DC power supply mounted on a vehicle, into a three-phase AC voltage, and output the three-phase AC voltage to a motor 3 of a three-phase AC system. The motor 3 functions as a travel driving source of the vehicle. The power conversion device 1 can also convert an electric power generated by the motor 3 into direct current and charge the battery 2. In this manner, the power conversion device 1 is capable of performing a bidirectional power conversion.

The power conversion device 1 includes a smoothing capacitor 4 and an inverter 10. A positive terminal of the smoothing capacitor 4 is connected to a positive electrode of the battery 2, which is an electrode on a high potential side of the battery 2, and a negative terminal of the smoothing capacitor 4 is connected to a negative electrode of the battery 2, which is an electrode on a low potential side of the battery 2. The inverter 10 converts the input DC power into a three-phase AC having a predetermined frequency, and outputs the three-phase AC to the motor 3. Further, the inverter 10 converts the AC power generated by the motor 3 into a DC power.

The inverter 10 has three phases of upper and lower arms 11 provided between a high potential power supply line 5 and a low potential power supply line 6. Each of the upper and lower arms 11 is a series circuit of an upper arm 12 and a lower arm 13. The high potential power supply line 5 is connected to a positive terminal of the smoothing capacitor 4, and the low potential power supply line 6 is connected to a negative terminal of the smoothing capacitor 4. In the present embodiment, an insulated gate bipolar transistor (hereinafter, referred to as an IGBT) is employed as a switching element configuring the upper and lower arm.

The upper arm 12 includes an IGBT 120 and a reflux diode 121 connected in anti-parallel to the IGBT 120. The upper arm 12 has multiple IGBTs 120 that are connected in parallel with each other. According to the present embodiment, the upper arm 12 has two IGBTs 120 and two diodes 121. The two IGBTs 120 are connected in parallel to each other, and the diodes 121 are connected in anti-parallel to the respective IGBTs 120. In addition, as the IGBTs 120, an n-channel type is employed. Collector electrodes of the IGBTs 120 and cathode electrodes of the diodes 121 are electrically connected to the high potential power supply line 5.

The lower arm 13 includes an IGBT 130 and a reflux diode 131 connected in anti-parallel to the IGBT 130. The lower arm 13 has multiple IGBTs 130 connected in parallel with each other. In the present embodiment, the lower arm 13 has two IGBTs 130 and two diodes 131. The two IGBTs 130 are connected in parallel to each other, and the diodes 131 are connected in anti-parallel to the respective IGBTs 130. In addition, as the IGBTs 130, an n-channel type is employed. Emitter electrodes of the IGBTs 130 and anode electrodes of the diodes 131 are electrically connected to the low potential power supply line 6.

Collector electrodes of the IGBTs 130 and cathode electrodes of the diodes 131 are electrically connected to emitter electrodes of the IGBTs 120 and anode electrodes of the diodes 121. Connection points between the emitter electrodes of the IGBT 120s and the collector electrodes of the IGBT 130s, that is, a connection point between the upper arm 12 and the lower arm 13, is electrically connected to an output line 7 to the motor 3.

In addition to the inverter 10 described above, the power conversion device 1 may include an inverter corresponding to a motor different from the motor 3, a boost converter for boosting a DC voltage supplied from the battery 2, a drive circuit for controlling the operation of the inverter 10 and the boost converter, and the like.

Figure 2:
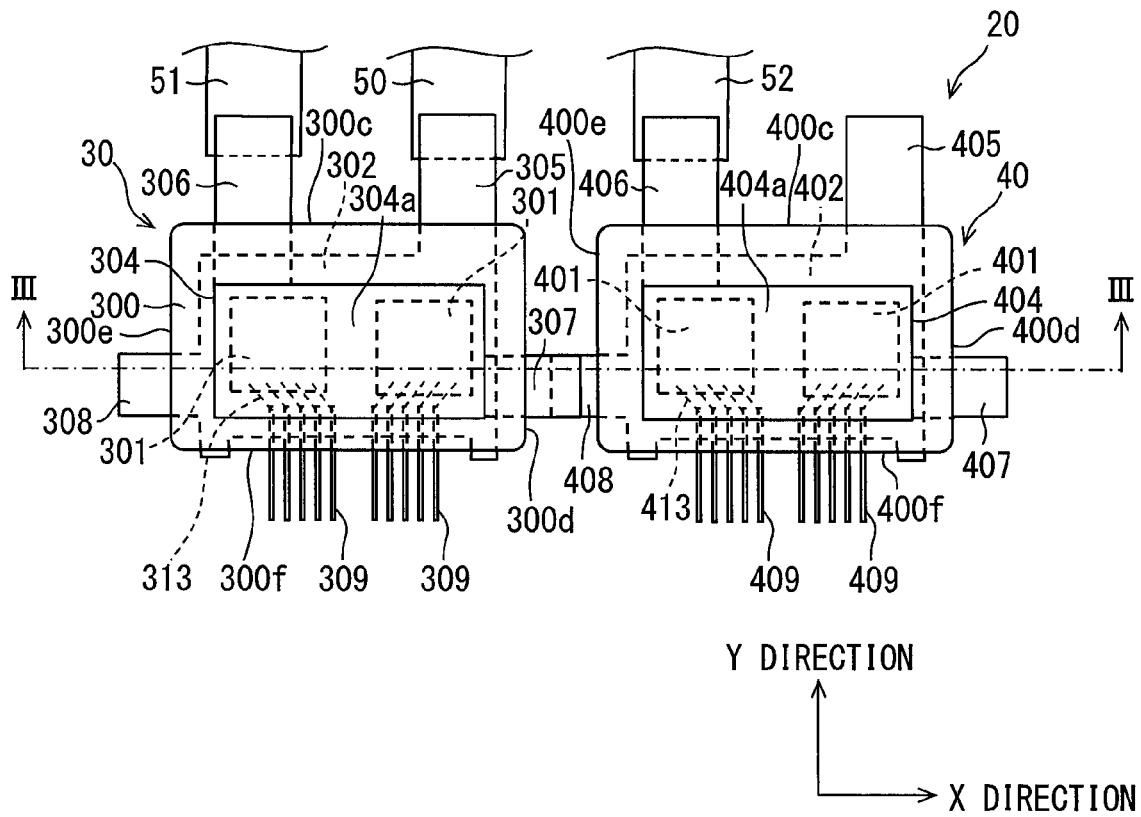
FIG. 2 is a plan view showing a schematic configuration of the semiconductor device.

Next, a semiconductor device 20 configuring the upper and lower arm 11 will be described with reference to FIGS. 2 and 3. FIG. 2 also shows a bus bar connected to the semiconductor device 20.

Figure 3:
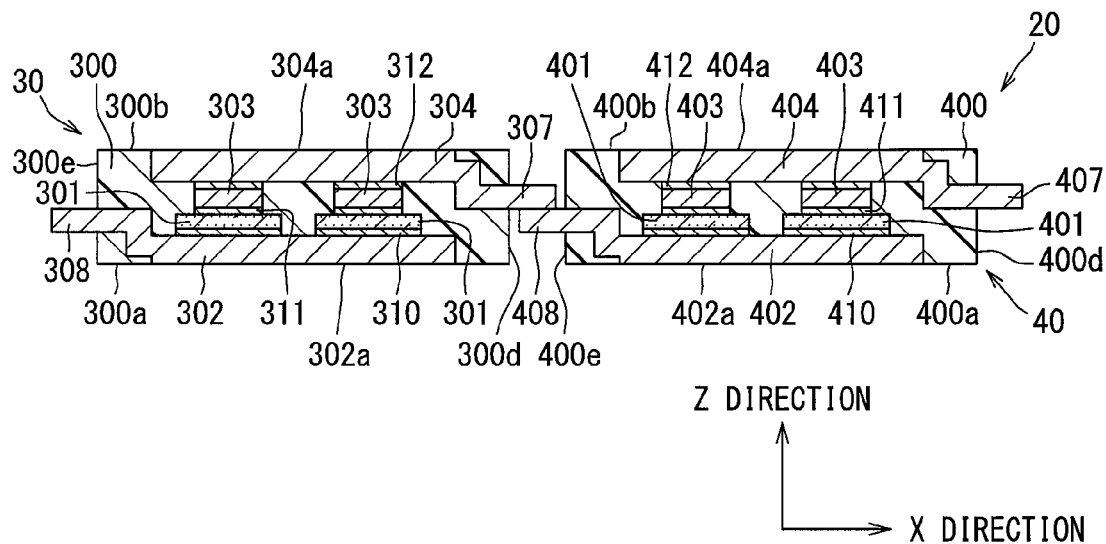
FIG. 3 is a cross-sectional view taken along a line III-III of FIG. 2.

As shown in FIGS. 2 and 3, the semiconductor device 20 includes a first semiconductor module 30 and a second semiconductor module 40. The first semiconductor module 30 configures the upper arm 12, and the second semiconductor module 40 configures the lower arm 13. For that reason, the first semiconductor module 30 is also referred to as an upper arm module, and the second semiconductor module 40 is also referred to as a lower arm module.

The first semiconductor module 30 includes a sealing resin body 300, semiconductor chips 301, a heat sink 302, a terminal 303, a heat sink 304, a positive electrode terminal 305, an output terminal 306, a relay terminal 307, a dummy terminal 308, and signal terminals 309. The second semiconductor module 40 includes a sealing resin body 400, semiconductor chips 401, a heat sink 402, a terminal 403, a heat sink 404, a dummy terminal 405, a negative electrode terminal 406, a dummy terminal 407, a relay terminal 408, and signal terminals 409. Hereinafter, the first semiconductor module 30 and the second semiconductor module 40 are also simply referred to as semiconductor modules 30 and 40. The semiconductor device 20 includes two semiconductor modules 30 and 40 having the same structure (common shape) as each other.

The sealing resin bodies 300 and 400 are made of, for example, epoxy resin. The sealing resin bodies 300 and 400 are molded by, for example, a transfer molding method. The sealing resin bodies 300 and 400 are each formed into a substantially rectangular parallelepiped shape. The sealing resin body 300 has one surface 300a orthogonal to the Z-direction, a back surface 300b opposite to the one surface 300a, and side surfaces 300c, 300d, 300e, and 300f connecting the one surface 300a and the back surface 300b. Similarly, the sealing resin body 400 has one surface 400a orthogonal to the Z-direction, a back surface 400b opposite to the one surface 400a, and side surfaces 400c, 400d, 400e, and 400f connecting the one surface 400a and the back surface 400b. The one surfaces 300a and 400a and the back surfaces 300b and 400b are flat surfaces, for example. The sealing resin body 300 corresponds to a first resin body, and the sealing resin body 400 corresponds to a second resin body.

In the semiconductor chip 301, the IGBT 120 and the diode 121 configuring the upper arm 12 are formed on a semiconductor substrate such as a silicon substrate or a silicon carbide substrate. In other words, an RC (Reverse Conducting)-IGBT) is formed in the semiconductor chip 301. The semiconductor chip 301 has a substantially rectangular planar shape. The first semiconductor module 30 has two semiconductor chips 301 configured as described above. The semiconductor chip 301 on which the IGBT 120 is formed corresponds to a first semiconductor element.

The IGBT 120 and the diode 121 have vertical structures so that a current flows in the Z-direction. In a plate thickness direction of the semiconductor chip 301, that is, in the Z-direction, a collector electrode (not shown) is formed on one surface of the semiconductor chip 301, and an emitter electrode (not shown) is formed on a back surface opposite to the one surface. The collector electrode also serves as the cathode electrode of the diode 121, and the emitter electrode also serves as the anode electrode of the diode 121.

The two semiconductor chips 301 have substantially the same planar shape and have substantially the same size and substantially the same thickness. The semiconductor chips 301 have the same structure. The semiconductor chips 301 are disposed such that the respective collector electrodes are on the same side in the Z-direction and the respective emitter electrodes are on the same side in the Z-direction. The semiconductor chips 301 are positioned at substantially the same height in the Z-direction and are aligned horizontally in the X-direction.

Pads (not shown) serving as signal electrodes are also formed on an emitter electrode forming surface of the semiconductor chip 301. The pads are formed at positions different from the emitter electrode. The pads are formed at an end opposite to a region where the emitter electrode is formed in the Y-direction. In the present embodiment, the semiconductor chip 301 has five pads. Specifically, the five pads are provided for a gate electrode, a Kelvin emitter for detecting the potential of the emitter electrode, a current sense, an anode potential of a temperature sensor (temperature sensitive diode) for detecting a temperature of the semiconductor chip 301, and a cathode potential. The five pads are collectively formed on one end side in the Y-direction and are aligned side by side in the X-direction in the semiconductor chip 301 having a substantially rectangular planar shape.

In each of the semiconductor chips 401, the IGBT 130 and the diode 131 configuring the lower arm 13 are formed on the semiconductor substrate. The semiconductor chip 401 has a substantially rectangular planar shape. The second semiconductor module 40 includes the two semiconductor chips 401. The semiconductor chip 401 on which the IGBT 130 is formed corresponds to a second semiconductor element. The semiconductor chip 401 has the same structure as the semiconductor chip 301. The collector electrodes of the two semiconductor chips 401 are disposed on the same side in the Z-direction as that of the collector electrodes of the semiconductor chip 301. The semiconductor chips 401 are positioned at substantially the same height as the semiconductor chips 301 in the Z-direction. The two semiconductor chips 401 are also aligned horizontally in the X-direction. The semiconductor chips 301 and 401 are also aligned in a row along the X-direction. The semiconductor chips 401 also have pads (not shown).

The heat sinks 302 and 402 function to dissipate heat of the respective semiconductor chips 301 and 401 to the outside of the semiconductor device 20, and also function as wirings. For that reason, in order to secure thermal conductivity and electrical conductivity, at least a metal material is used. In the present embodiment, the heat sinks 302 and 402 are provided so as to encompass the respective semiconductor chips 301 and 401 in a projection view projected in the Z-direction. The heat sinks 302 and 402 are disposed adjacent to one surface 300a of the sealing resin body 300 with respect to the respective semiconductor chips 301 and 401 in the Z-direction.

The heat sinks 302 and 402 are electrically connected to the collector electrodes of the semiconductor chips 301 and 401 through solders 310 and 410, respectively. More specifically, the collector electrodes of the two semiconductor chips 301 are connected to the same surface of the heat sink 302 through the solders 310. The collector electrodes of the two semiconductor chips 401 are connected to the same surface of the heat sink 402 through the solders 410. The heat sinks 302 and 402 are substantially rectangular in a plan view.

In the surfaces of the heat sinks 302 and 402, heat radiation surfaces 302a and 402a opposite to the respective semiconductor chips 301 and 401 are exposed from the sealing resin body 300. The heat radiation surfaces 302a and 402*a* are substantially flush with the one surface 300*a*. In the surfaces of the heat sinks 302 and 402, portions other than the connection portions with the solders 310 and 410 and the heat radiation surfaces 302*a* and 402*a* are covered with the sealing resin body 300. The heat sinks 302 and 402 are disposed side by side in the X-direction, and are disposed at substantially the same position in the Z-direction.

The terminals 303 and 403 are interposed between the semiconductor chips 301 and 401 and the heat sinks 304 and 404, respectively. More specifically, the terminal 303 is disposed between the semiconductor chip 301 and the heat sink 304, and the terminal 403 is disposed between the semiconductor chip 401 and the heat sink 404. Since the terminals 303 and 403 are positioned in the middle of thermal conduction and electrical conduction paths between the semiconductor chips 301 and 401 and the heat sinks 304 and 404, the terminals 303 and 304 are made of at least a metal material in order to ensure a thermal conductivity and an electrical conductivity.

The terminals 303 and 403 are disposed to face the emitter electrodes of the semiconductor chips 301 and 401, and are electrically connected to the emitter electrodes through solders 311 and 411, respectively. In the present embodiment, the semiconductor device 20 has the same number of terminals 303 and 403 as the number of semiconductor chips 301 and 401. An emitter electrode of the semiconductor chip 301 is connected to a terminal 303 through the solder 311. An emitter electrode of the semiconductor chip 401 is connected to the terminal 403 through the solder 411.

Similarly to the heat sinks 302 and 402, the heat sinks 304 and 404 also function to dissipate heat of the respective semiconductor chips 301 and 401 to the outside of the semiconductor device 20, and also function as wirings. In the present embodiment, the heat sinks 304 and 404 are provided so as to encompass the respective semiconductor chips 301 and 401 in a projection view projected in the Z-direction. The heat sinks 304 and 404 are disposed adjacent to the back surface 300*b* of the sealing resin body 300, with respect to the respective semiconductor chips 301 and 401 in the Z-direction. The heat sinks 304 and 404 are substantially rectangular in a plan view.

The heat sinks 304 and 404 are electrically connected to the emitter electrodes of the respective semiconductor chips 301 and 401, respectively. The heat sink 304 is electrically connected to the emitter electrode of the semiconductor chip 301 through the solder 311, the terminal 303, and the solder 312. The emitter electrodes of the two semiconductor chips 301 are electrically connected to the same surface of the heat sink 304. The heat sink 404 is electrically connected to the emitter electrode of the semiconductor chip 401 through the solder 411, the terminal 403, and the solder 412. The emitter electrodes of the two semiconductor chips 401 are electrically connected to the same surface of the heat sink 404.

Of the surfaces of the heat sinks 304 and 404, heat radiation surfaces 304*a* and 404*a* opposite to the respective semiconductor chips 301 and 401 are exposed from the sealing resin body 300. The heat radiation surfaces 304*a* and 404*a* are substantially flush with the back surface 300*b*. In the surfaces of the heat sinks 304 and 404, portions except for the connection portions with the solders 312 and 412 and the heat radiation surfaces 304*a* and 404*a* are covered with the sealing resin body 300. The heat sinks 304 and 404 are disposed side by side in the X-direction, and are disposed at substantially the same position in the Z-direction.

The positive electrode terminal 305 is a main terminal for external connection for connecting the semiconductor device 20 to the high potential power supply line 5. The positive electrode terminal 305 is also referred to as a high potential power supply terminal and a P terminal. The positive electrode terminal 305 is connected to the heat sink 302 and extends from the heat sink 302 in the Y-direction. In the present embodiment, the positive electrode terminal 305 is integrally provided with the heat sink 302 by processing the same metal plate.

The positive electrode terminal 305 is connected to one end of the heat sink 302 in the Y-direction. The positive electrode terminal 305 protrudes to the outside from the side surface 300*c* of the sealing resin body 300. The positive electrode terminal 305 protrudes to the outside from a position closer to the second semiconductor module 40 than a center of the first semiconductor module 30 in the X-direction. The positive electrode terminal 305 is connected to the heat sink 302 at a position deviated from a center of the heat sink 302 in the X-direction toward the second semiconductor module 40.

The positive electrode terminal 305 may be a member separate from the heat sink 302 and connected to the heat sink 302, thereby being capable of employing a configuration connected the heat sink 302. A bus bar 50 formed of a metal plate is connected to the protruding portion of the positive electrode terminal 305. The positive electrode terminal 305 and the bus bar 50 are welded, for example. The positive electrode terminal 305 is electrically connected to the positive electrode terminal of the smoothing capacitor 4 through the bus bar 50.

The second semiconductor module 40 has a dummy terminal 405 at a position corresponding to the positive electrode terminal 305. The dummy terminal 405 is a terminal to which no bus bar is connected. The dummy terminal 405 can also be referred to as a terminal that does not provide an electrical connection function. The dummy terminal 405 is connected to the heat sink 402 and extends from the heat sink 402 in the Y-direction. In the present embodiment, the dummy terminal 405 is integrally provided with the heat sink 402 by processing the same metal plate. The positional relationship of the dummy terminal 405 in the heat sink 402 is the same as the positional relationship of the positive electrode terminal 305 in the heat sink 302. The dummy terminal 405 protrudes to the outside from the side surface 400*c* on the same side as that of the side surface 300*c* from which the positive electrode terminal 305 protrudes.

As described above, in the first semiconductor module 30, the main terminal (first main terminal) connected to the heat sink that is connected to the collector electrode functions as the positive electrode terminal 305. In the second semiconductor module 40, the main terminal (first main terminal) connected to the heat sink that is connected to the collector electrode functions as the dummy terminal 405.

The output terminal 306 is a main terminal for external connection electrically connected to the connection point of the upper arm 12 and the lower arm 13. The output terminal 306 is also referred to as an O terminal. The output terminal 306 is connected to the heat sink 304, and extends from the heat sink 304 on the same side as that of the positive electrode terminal 305 in the Y-direction. In the present embodiment, the output terminal 306 is integrally provided with the heat sink 304 by processing the same metal plate. The output terminal 306 is connected to one end of the heat sink 304 on the same side as that of the positive electrode terminal 305. In the X-direction, the positive electrode terminal 305 is provided adjacent to one end of the heat sink 304, and an output terminal 306 is provided adjacent to the other end of the heat sink 304. The output terminal 306 protrudes to the outside from the same side surface 300c as the positive electrode terminal 305.

The output terminal 306 may be a separate member from the heat sink 304. A bus bar 51, which is a metal plate, is connected to the protruding portion of the output terminal 306. The output terminal 306 is electrically connected to a coil of the corresponding phase of the motor 3 through the bus bar 51.

The second semiconductor module 40 has a negative electrode terminal 406 at a position corresponding to the output terminal 306. The negative electrode terminal 406 is a main terminal for external connection for connecting the semiconductor device 20 to the low potential power supply line 6. The negative electrode terminal 406 is also referred to as a low potential power supply terminal and an N terminal. The negative electrode terminal 406 is connected to the heat sink 404, and extends from the heat sink 404 in the Y-direction on the same side as the positive electrode terminal 305. In the present embodiment, the negative electrode terminal 406 is integrally provided with the heat sink 404 by processing the same metal plate. A positional relationship of the negative electrode terminal 406 in the heat sink 404 is the same as the positional relationship of the output terminal 306 in the heat sink 304.

The negative electrode terminal 406 is connected to one end of the heat sink 404 in the Y-direction. The negative electrode terminal 406 protrudes to the outside from the same side surface 400c as the dummy terminal 405. The negative electrode terminal 406 protrudes from a position closer to the first semiconductor module 30 than a center of the second semiconductor module 40 in the X-direction. The negative electrode terminal 406 is connected to the heat sink 404 at a position deviated toward the first semiconductor module 30 side from a center of the heat sink 404 in the X-direction.

The negative electrode terminal 406 may be a member separate from the heat sink 404. A bus bar 52, which is a metal plate, is connected to the protruding portion of the negative electrode terminal 406. The negative electrode terminal 406 is electrically connected to the negative terminal of the smoothing capacitor 4 through the bus bar 52.

As described above, in the first semiconductor module 30, the main terminal (second main terminal) connected to the heat sink that is connected to the emitter electrode functions as the output terminal 306. In the second semiconductor module 40, the main terminal (second main terminal) connected to the heat sink that is connected to the emitter electrode functions as the negative electrode terminal 406.

The protruding portions of the positive electrode terminal 305, the output terminal 306, the dummy terminal 405, and the negative electrode terminal 406 are disposed at substantially the same positions in the Z-direction. In the X-direction, the output terminal 306 (0 terminal), the positive electrode terminal 305 (P terminal), the negative electrode terminal 406 (N terminal), and the dummy terminal 405 are disposed in a stated order. In other words, the negative electrode terminal 406 connected to the low potential power supply line 6 is arranged adjacent to the positive electrode terminal 305 connected to the high potential power supply line 5.

The relay terminal 307 is a terminal for electrically connecting the emitter electrode of the semiconductor chip 301 configuring the upper arm 12 and the collector electrode of the semiconductor chip 401 configuring the lower arm 13. The relay terminal 307 is connected to the heat sink 304, and extends from the heat sink 304 toward the second semiconductor module 40 in the X-direction. In the present embodiment, the relay terminal 307 is integrally provided with the heat sink 304 by processing the same metal plate. The relay terminal 307 is connected to one end of the heat sink 304 in the X-direction, which is closer to the second semiconductor module 40. The relay terminal 307 protrudes from the side surface 300d of the sealing resin body 300. The relay terminal 307 may be a separate member from the heat sink 304.

The second semiconductor module 40 has a dummy terminal 407 at a position corresponding to the relay terminal 307. The dummy terminal 407 is a terminal that is not connected to the relay terminal 307. The dummy terminal 407 can also be referred to as a terminal that does not provide an electrical connection function. The dummy terminal 407 is connected to the heat sink 404 and extends in the X-direction from the heat sink 404. In the present embodiment, the dummy terminal 407 is integrally provided with the heat sink 404 by processing the same metal plate. The dummy terminal 407 is connected to one end of the heat sink 404 in the X-direction, which is an end on the far side from the first semiconductor module 30. The dummy terminal 407 protrudes from the side surface 400d of the sealing resin body 400. The dummy terminal 407 may be a separate member from the heat sink 404.

As described above, in the first semiconductor module 30, the terminal connected to the heat sink that is connected to the emitter electrode and extending in the X-direction functions as the relay terminal 307. In the second semiconductor module 40, the terminal connected to the heat sink that is connected to the emitter electrode and extending in the X-direction functions as the dummy terminal 407.

Similarly to the relay terminal 307, the relay terminal 408 is also a terminal for electrically connecting the emitter electrode of the semiconductor chip 301 configuring the upper arm 12 and the collector electrode of the semiconductor chip 401 configuring the lower arm 13. The relay terminal 408 is connected to the heat sink 402, and extends from the heat sink 402 toward the first semiconductor module 30 in the X-direction. In the present embodiment, the relay terminal 408 is integrally provided with the heat sink 402 by processing the same metal plate. The relay terminal 408 is connected to one end of the heat sink 402 in the X-direction, which is closer to the first semiconductor module 30. The relay terminal 408 protrudes from the side surface 400e of the sealing resin body 400. The relay terminal 408 may be a separate member from the heat sink 402.

The protruding portions of the relay terminals 307 and 408 are disposed in a facing region of the sealing resin bodies 300 and 400. The relay terminals 307 and 408 protrude from the same position in the Y-direction. In other words, the protruding portion of the relay terminal 307 on the side surface 300d and the protruding portion of the relay terminal 408 on the side surface 400e have the same Y coordinate position. The protruding portions of the relay terminals 307 and 408 are stacked on each other and connected to each other by welding or the like. The relay terminal 307 corresponds to a first relay terminal, and the relay terminal 408 corresponds to a second relay terminal.

The first semiconductor module 30 has a dummy terminal 308 at a position corresponding to the relay terminal 408. The dummy terminal 308 is a terminal that is not electrically connected to the relay terminal 408. The dummy terminal 308 can also be referred to as a terminal that does not provide an electrical connection function. The dummy terminal 308 is connected to the heat sink 302 and extends in the X-direction from the heat sink 302. In the present embodiment, the dummy terminal 308 is integrally provided with the heat sink 302 by processing the same metal plate. The dummy terminal 308 is connected to one end of the heat sink 302 in the X-direction, which is an end on a side far from the second semiconductor module 40. The dummy terminal 308 protrudes from the side surface 300e of the sealing resin body 300. The dummy terminal 308 may be a separate member from the heat sink 302.

As described above, in the first semiconductor module 30, the terminal connected to the heat sink that is connected to the collector electrode and extending in the X-direction functions as the dummy terminal 308. In the second semiconductor module 40, the terminal connected to the heat sink that is connected to the collector electrode and extending in the X-direction functions as the relay terminal 408.

The signal terminals 309 and 409 are electrically connected to the pads of the semiconductor chips 301 and 401 through bonding wires 313 and 413, respectively. The signal terminal 309 extends in the Y-direction and protrudes to the outside from a side surface 300f of the sealing resin body 300 opposite to the side surface 300c. The signal terminal 409 extends in the Y-direction, and protrudes to the outside from a side surface 400f of the sealing resin body 400 opposite to the side surface 400c.

Next, a stacked structure of the semiconductor devices 20 and the coolers will be described with reference to FIG. 4.

The semiconductor devices 20 and the coolers are alternately stacked on each other to form a power module. As shown in FIG. 4, the power module 60 includes coolers 61 in addition to the semiconductor devices 20 described above.

The coolers 61 are each configured to allow a refrigerant to circulate inside, and are disposed on both sides of each semiconductor device 20 in the Z-direction to cool the semiconductor device 20 from both sides. The coolers 61 are each formed in a tubular shape (tube shape) so as to have a passage through which the refrigerant flows. In the Z-direction, the coolers 61 are arranged at a predetermined distance so that the semiconductor devices 20 and the coolers 61 are alternately stacked on each other.

The adjacent coolers 61 are connected to each other at one end side in the X-direction through an upstream side coupling portion 62. The upstream side coupling portion 62 functions to distribute the supplied refrigerant (outline arrow R in FIG. 4) to the respective coolers 61. On the other hand, on the other end side in the X-direction, the adjacent coolers 61 are coupled to each other through a downstream side coupling portion 63. The downstream side coupling portion 63 functions to join the refrigerants distributed to the respective coolers 61 together.

Figure 4:
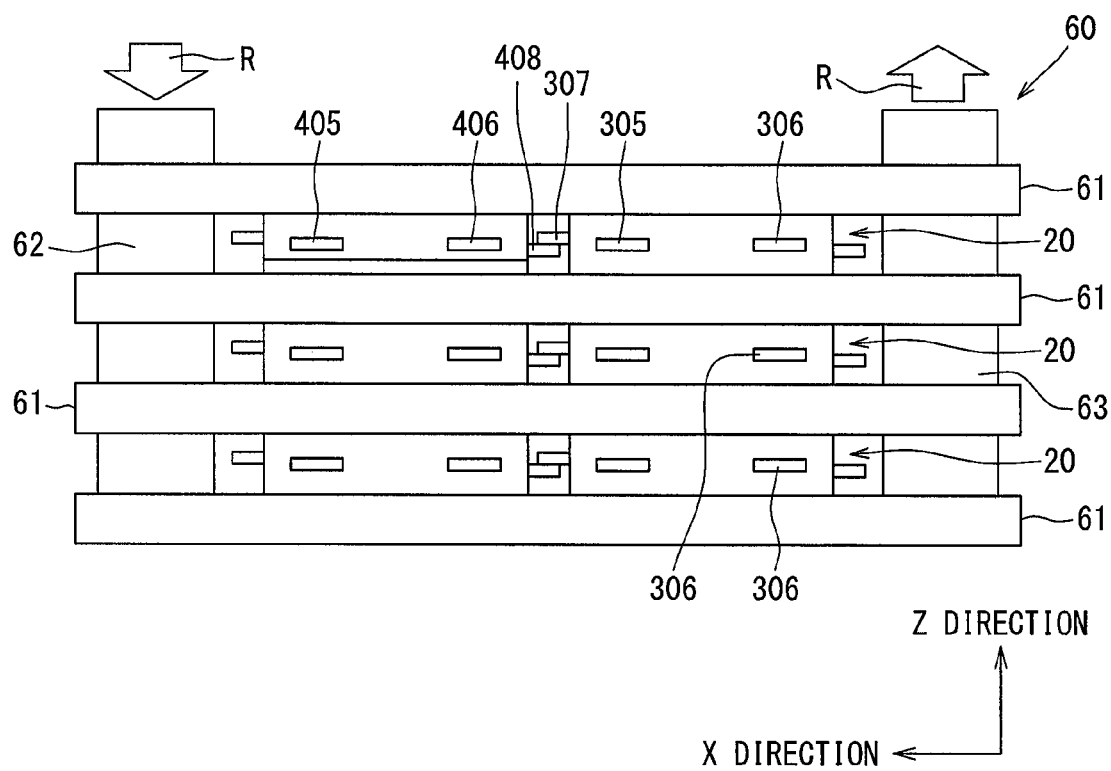
FIG. 4 is a plan view showing a stacked structure of the semiconductor device and a cooler.

The power module 60 shown in FIG. 4 includes three semiconductor devices 20 configuring the upper and lower arms 11 of respective phases of the inverter 10, and multiple coolers 61 alternately stacked with the semiconductor devices 20 so as to cool the semiconductor devices 20 from both sides. Each of the semiconductor devices 20 is disposed between the coolers 61 in the Z-direction.

Next, the effects of the semiconductor device 20 will be described.

Figure 5:
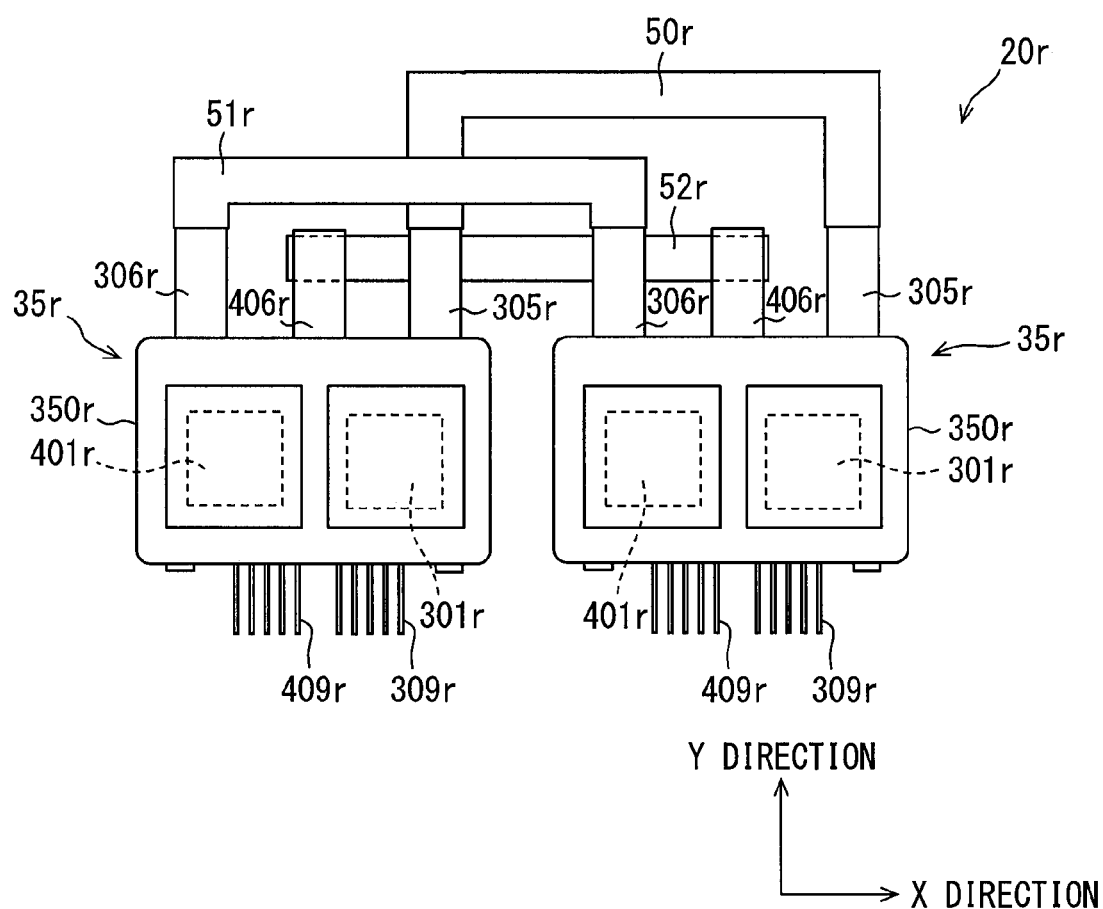
FIG. 5 is a plan view showing a reference example.

FIG. 5 shows a reference example of a semiconductor device having two semiconductor packages each having a 2-in-1 package structure configuring upper and lower arms in order to increase a current capacity. FIG. 5 corresponds to FIG. 2, but the structure of the portion covered with the sealing resin body is partially omitted. In the reference example, the element related to the present embodiment is given r at the end of the symbol of the element of the present embodiment.

A semiconductor device 20r shown in FIG. 5 includes two semiconductor modules 35r. Each of the semiconductor modules 35r has a 2-in-1 package structure. Each semiconductor module 35r includes semiconductor chips 301r and 401r. The semiconductor chips 301r and 401r are sealed with a sealing resin body 350r. Each semiconductor module 35r has a positive electrode terminal 305r (P terminal), a negative electrode terminal 406r (N terminal), and an output terminal 306r (O terminal) as main terminals for external connection.

The positive electrode terminals 305r are electrically connected to each other by a bus bar 50r, and the output terminals 306r are electrically connected to each other by a bus bar 51r. The negative electrode terminals 406r are electrically connected to each other by a bus bar 52r. As a result, the IGBTs of the semiconductor chip 301r on the upper arm side are connected in parallel to each other, and the IGBTs of the semiconductor chip 401r on the lower arm side are connected in parallel to each other to configure the upper and lower arm for one phase.

As described above, the semiconductor device 20r shown in the reference example has two positive electrode terminals 305r, two negative electrode terminals 406r, and two output terminals 306r, and thus has a large number of terminals. The connection points of the terminals 305r, 306r, and 406r and the bus bars 50r, 51r, and 52r are six points in total.

Further, as shown in FIG. 5, when the two semiconductor modules 35r are aligned in the X-direction, a connection structure of the bus bars 50r, 51r, and 52r is complicated because the bus bars must be arranged so as not to come in contact with each other. As a result, the bus bars 50r, 51r, and 52r are also lengthened, and the inductance is increased.

On the contrary, according to the present embodiment, in the first semiconductor module 30, the multiple IGBTs 120 (semiconductor chips 301) configuring the upper arm 12 are connected in parallel to each other. In the second semiconductor module 40, the multiple IGBTs 140 (semiconductor chips 401) configuring the lower arm 13 are connected in parallel to each other. In this manner, the semiconductor chips 301 on the upper arm side are collectively disposed in the first semiconductor module 30, and the semiconductor chips 401 on the lower arm side are collectively disposed in the second semiconductor module 40. Therefore, the positive electrode terminal 305 may be provided only to the first semiconductor module 30, and the negative electrode terminal 406 may be provided only to the second semiconductor module 40. As a result, the number of terminals and the number of connection points of the terminals can be reduced. In the present embodiment, the number of the connection points of the terminals is four in total including a connection point of the positive electrode terminal 305 with the bus bar 50, a connection point of the output terminal 306 with the bus bar 51, a connection point of the negative electrode terminal 406 with the bus bar 52, and a connection point of the relay terminals 307 and 408. Therefore, the number of the connection points can be reduced to be less than 6 of the reference example.

In addition, only the first semiconductor module 30 has the positive electrode terminal 305, and only the second semiconductor module 40 has the negative electrode terminal 406. For that reason, in the two semiconductor modules 30 and 40, the respective positive electrode terminals and the respective negative electrode terminals do not need to be connected to each other through the bus bars. Therefore, the bus bar structure can be simplified and the length of the bus bars can be shortened. Therefore, the inductance can be reduced as compared with the reference example.

Therefore, in view of the body size of the power module 60 in which the semiconductor modules 30 and 40 are stacked on each other in the cooler 61, the number of connection points of the terminals can be reduced and the inductance can be reduced in the configuration in which the two semiconductor modules 30 and 40 are aligned side by side in the X-direction because of the aspect ratio between the length in the Z-direction, which is the stacking direction, and the length in the X-direction, that is, the constraint of mounting the vehicle.

In particular, in the present embodiment, the negative electrode terminal 406 protrudes from the side surface 400c on the same side as that of the side surface 300c of the sealing resin body 300 from which the positive electrode terminal 305 protrudes. As a result, the positive electrode terminal 305 and the negative electrode terminal 406 are close to each other, so that the inductance can be reduced by the effect of magnetic flux cancellation. Since the positive electrode terminal 305 and the negative electrode terminal 406 protrude on the same side in the Y-direction, the bus bars 50 and 52 can be welded in a short time.

Further, in the present embodiment, the positive electrode terminal 305 protrudes from a portion closer to the second semiconductor module 40 than the center of the first semiconductor module 30 in the X-direction. The negative electrode terminal 406 protrudes from a portion closer to the first semiconductor module 30 than the center of the second semiconductor module 40 in the X-direction. As a result, the positive electrode terminal 305 and the negative electrode terminal 406 become closer to each other, and the inductance can be reduced.

Further, in the present embodiment, the negative electrode terminal 406 is disposed adjacent to the positive electrode terminal 305 in the X-direction. As a result, the positive electrode terminal 305 and the negative electrode terminal 406 become closer to each other, thereby being capable of reducing the inductance.

Further, in the present embodiment, the protruding portions of the relay terminals 307 and 408 are disposed in a facing region of the sealing resin bodies 300 and 400, and the relay terminals 307 and 408 are connected to each other in the facing region. As a result, a connection distance between the upper arm 12 and the lower arm 13 by the relay terminals 307 and 408 can be shortened, and the inductance can be reduced.

Further, in the present embodiment, the protruding portion of the relay terminal 307 on the side surface 300d and the protruding portion of the relay terminal 408 on the side surface 400e are at the same Y coordinate position. As a result, the connection distance between the relay terminals 307 and 408 becomes shorter, and the inductance can be reduced.

Further, in the present embodiment, the semiconductor modules 30 and 40 have a common shape. Since the first semiconductor module 30 and the second semiconductor module 40 do not need to be separately formed, for example, the manufacturing cost can be reduced.

Figure 6:
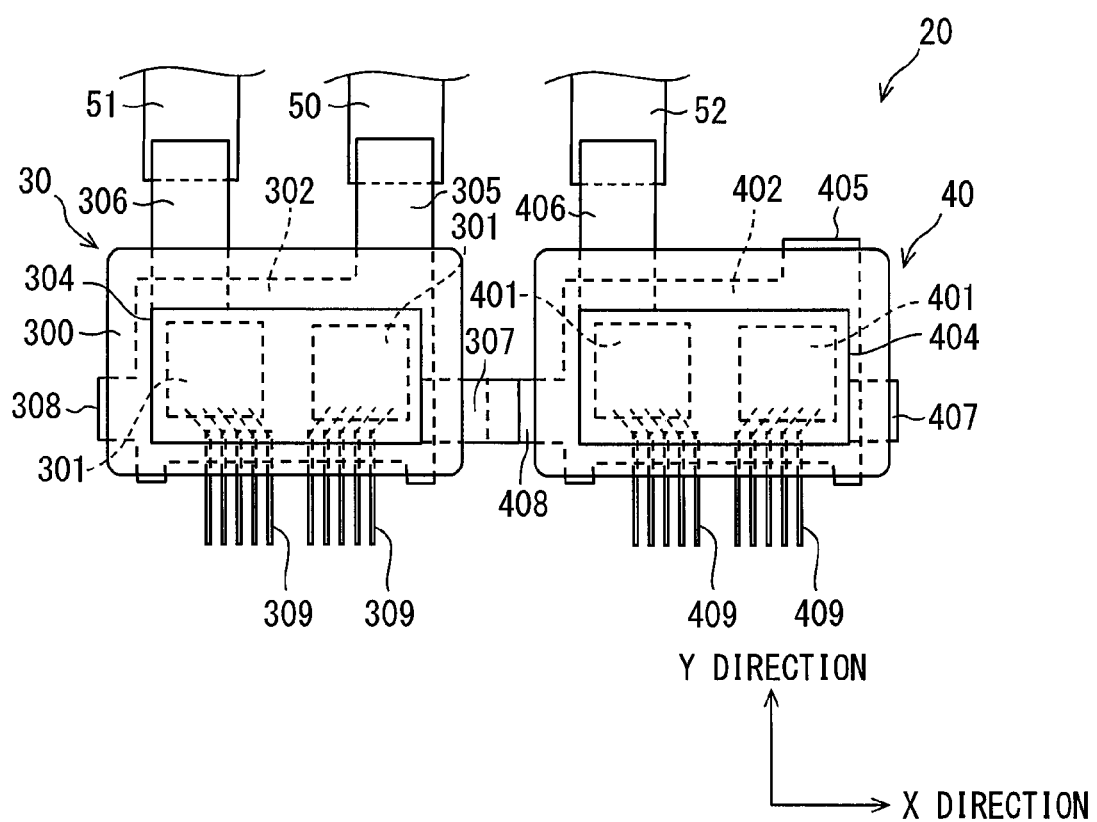
FIG. 6 is a plan view showing a first modification.

However, a configuration in which the terminals that do not provide an electrical connection function does not protrude from the respective sealing resin bodies 300 and 400 as much as possible can be employed. For example, after molding the sealing resin bodies 300 and 400, the terminals that do not provide the electrical connection function may be cut off together with tie bars of the lead frame. In a first modification shown in FIG. 6, the dummy terminals 308, 405, and 407 are cut off at the base portions of the protruding portions.

Further, in the present embodiment, the first semiconductor module 30 has the output terminal 306 in addition to the relay terminal 307. The output terminal 306 protrudes from the same side surface 300c as that of the positive electrode terminal 305, and the relay terminal 307 protrudes from the side surface 300d facing the sealing resin body 400. As a result, the connection distance between the upper arm 12 and the lower arm 13 can be shortened, and the welding of the bus bars 50, 51, and 52 can be performed in a short time while reducing the inductance.

Figure 7:
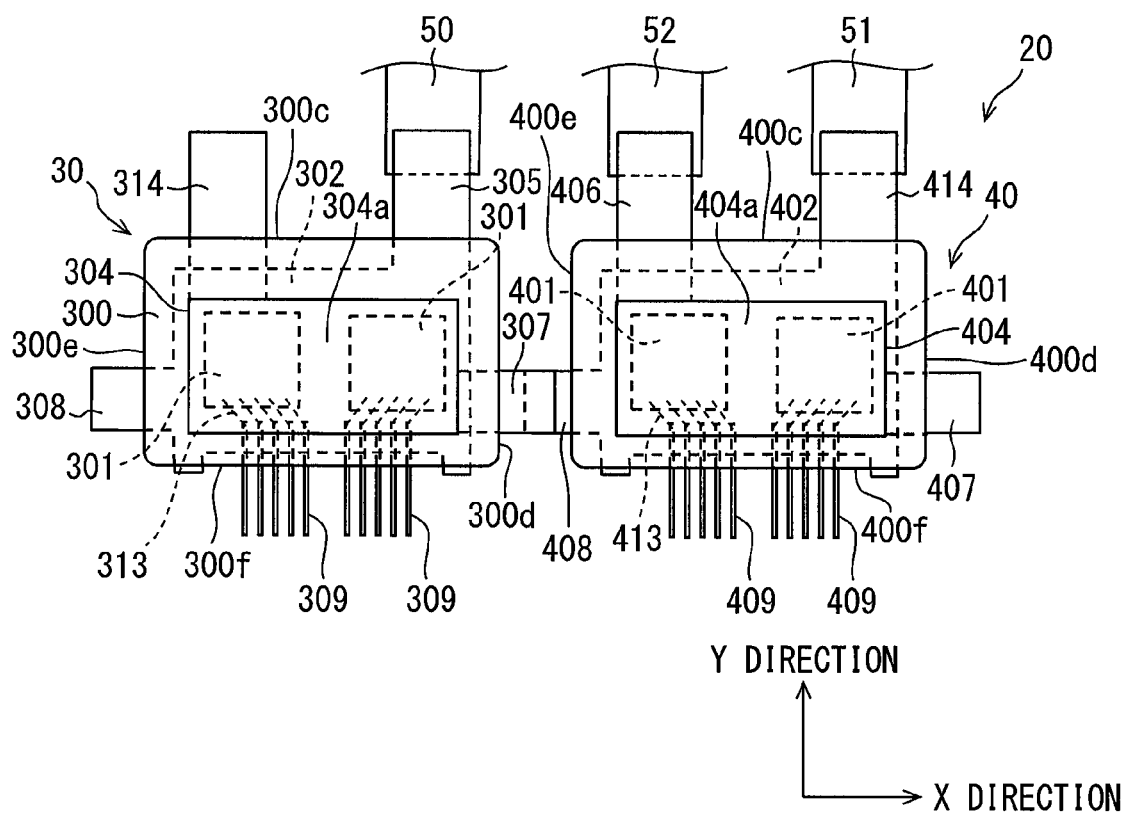
FIG. 7 is a plan view showing a second modification.

For example, as in a second modification shown in FIG. 7, the first semiconductor module 30 may have a dummy terminal 314, and the second semiconductor module 40 may have an output terminal 414 separately from the relay terminal 408. The dummy terminal 314 is the same as the output terminal 306 except that the bus bar 51 is not connected. The output terminal 414 is the same as the dummy terminal 405 except that the bus bar 51 is connected. This can also provide the same effect.

Second Embodiment

The present embodiment can refer to the preceding embodiment. For that reason, descriptions of portions common to the semiconductor device 20 described in the preceding embodiment will be omitted.

Figure 8:
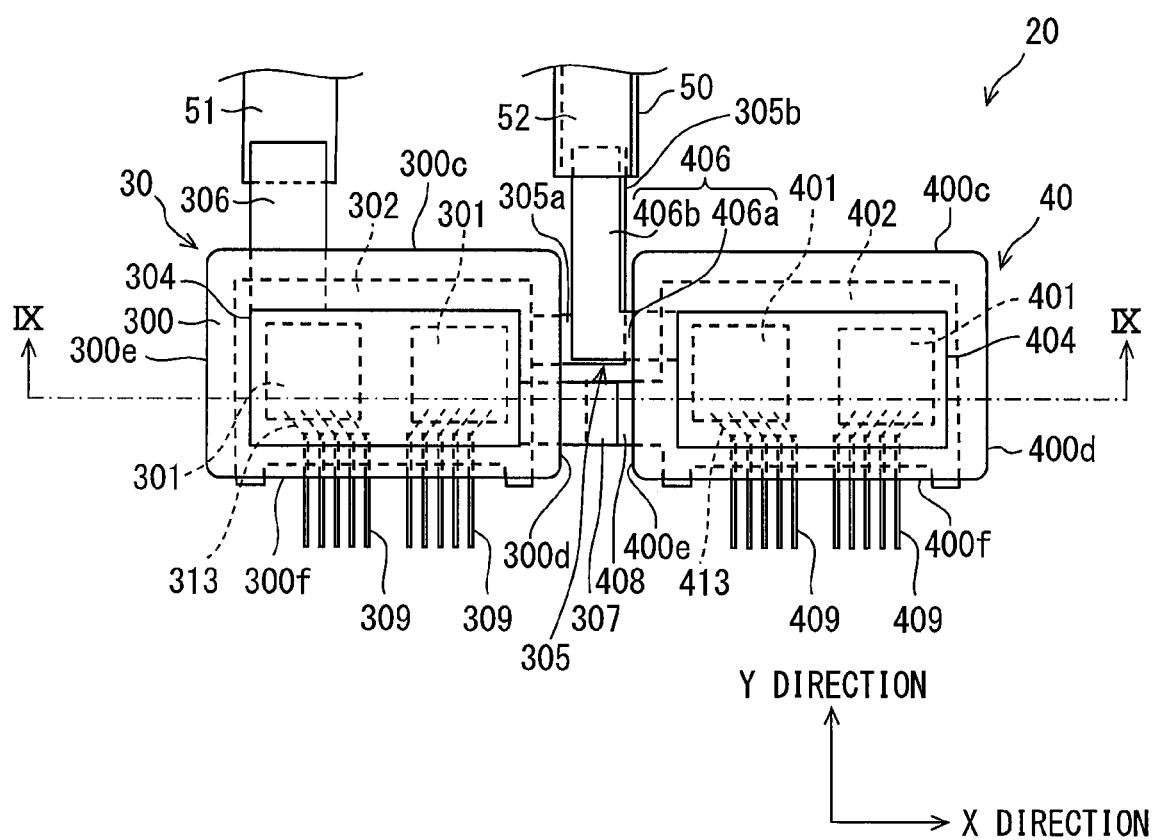
FIG. 8 is a plan view showing a schematic configuration of a semiconductor device according to a second embodiment.
Figure 9:
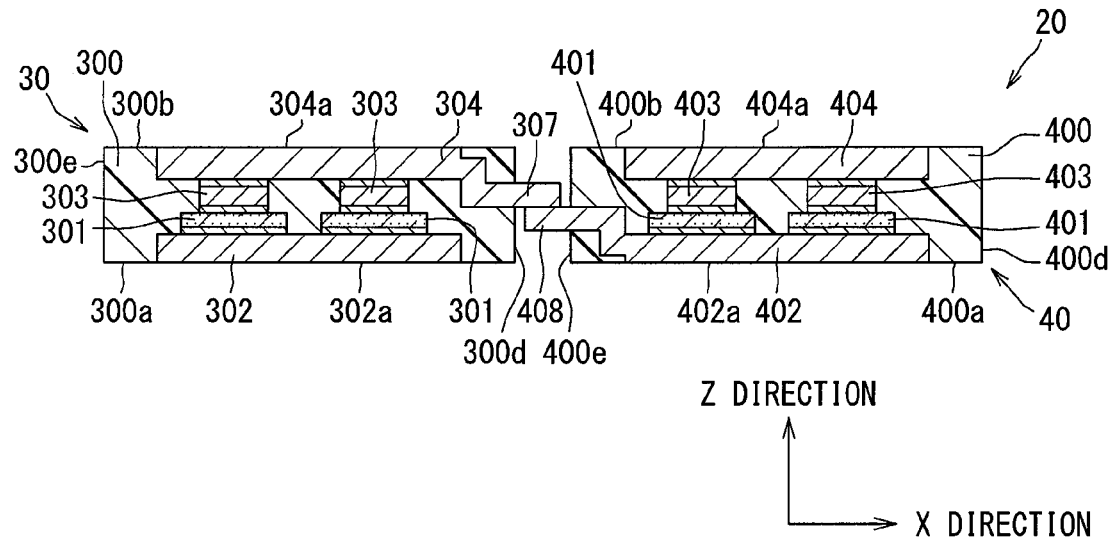
FIG. 9 is a cross-sectional view taken along a line IX-IX of FIG. 8.

As shown in FIGS. 8 and 9, in the present embodiment, a positive electrode terminal 305 protrudes from a side surface 300d of a sealing resin body 300, and a negative electrode terminal 406 protrudes from a side surface 400e of a sealing resin body 400. In other words, the positive electrode terminal 305 and the negative electrode terminal 406 protrude from the side surfaces 300d and 400e of the sealing resin bodies 300 and 400, which face each other, respectively. Further, the protruding portion of the positive electrode terminal 305 and the protruding portion of the negative electrode terminal 406 are located between the sealing resin bodies 300 and 400 in the X-direction.

The positive electrode terminal 305 is substantially L-shaped in a plan view. The positive electrode terminal 305 has, as portions protruding from the side surface 300d of the sealing resin body 300, a lateral portion 305a extending along the X-direction and a longitudinal portion 305b extending along the Y-direction. One end of the lateral portion 305a is a boundary portion with the side surface 300d, and the other end of the lateral portion 305a is connected with the longitudinal portion 305b. The bus bar 50 is connected to a vicinity of an end of the longitudinal portion 305b opposite to the lateral portion 305a. A part of the longitudinal portion 305b and the lateral portion 305a in the protruding portion of the positive electrode terminal 305 are disposed in the facing region of the side surfaces 300d and 400e. The remaining portion of the longitudinal portion 305b extends out of the facing region.

The negative electrode terminal 406 is also substantially L-shaped in a plan view. The negative electrode terminal 406 has, as portions protruding from the side surface 400e of the sealing resin body 400, a lateral portion 406a extending along the X-direction and a longitudinal portion 406b extending along the Y-direction. One end of the lateral portion 406a is a boundary portion with the side surface 400e, and the other end of the lateral portion 406a is connected with the longitudinal portion 406b. The bus bar 52 is connected to the vicinity of the end of the longitudinal portion 406b opposite to the lateral portion 406a. A part of the longitudinal portion 406b and the lateral portion 406a in the protruding portion of the negative electrode terminal 406 are disposed in a facing region of the side surfaces 300d and 400e. The remaining portion of the longitudinal portion 406b extends out of the facing region.

The positive electrode terminal 305 and the negative electrode terminal 406 are provided at a predetermined interval in the Z-direction. In addition, at least a part of the longitudinal portions 305b and 406b of the protruding portion is provided so as to face each other in the Z-direction. In the present embodiment, as shown in FIG. 8, the longitudinal portions 305b and 406b are provided so as to face each other in substantially the entire length. In this example, a term "facing" indicates a positional relationship overlapping in a projection view projected in the Z-direction.

In the present embodiment, the first semiconductor module 30 does not have the dummy terminal 308, and the second semiconductor module 40 does not have the dummy terminals 405 and 407. The other configuration is the same as that of the first embodiment shown in FIG. 2.

Next, the effects of the semiconductor device 20 will be described.

In the present embodiment, the protruding portions of the positive electrode terminal 305 and the protruding portion of the negative electrode terminal 406 are located between the sealing resin bodies 300 and 400 in the X-direction. As a result, since the positive electrode terminal 305 and the negative electrode terminal 406 are close to each other, the inductance can be reduced. In addition, the bus bars 50 and 52 can be welded in a short time. That is, productivity can be improved.

Figure 10:
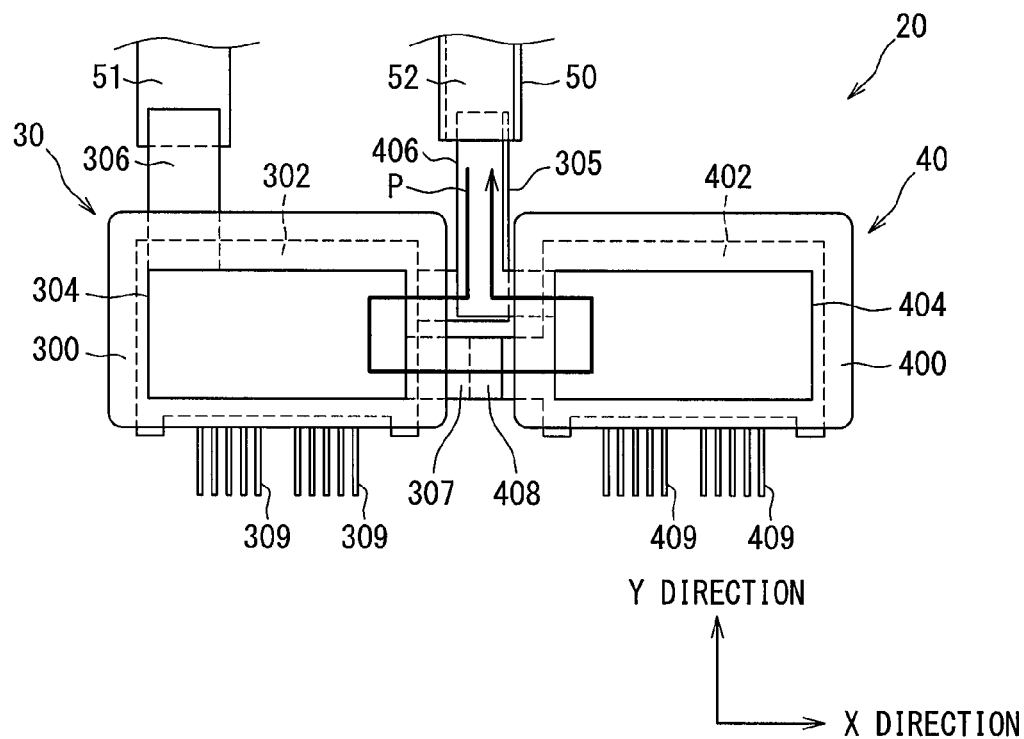
FIG. 10 is a diagram showing a current path of an upper and lower arm.

In particular, in the present embodiment, at least a part of the positive electrode terminal 305 and the negative electrode terminal 406 are provided so as to face each other in the Z-direction. As a result, the inductance can be further reduced. As indicated by a solid arrow P in FIG. 10, a current path of the upper and lower arm 11 is in a loop shape. As a result, an eddy current is generated in the cooler 61 facing the semiconductor device 20. Therefore, the inductance can also be reduced in this case.

Also in the present embodiment, the protruding portions of the relay terminals 307 and 408 are disposed in the facing region of the sealing resin bodies 300 and 400. The protruding portion of the relay terminal 307 on the side surface 300d and the protruding portion of the relay terminal 408 on the side surface 400e have the same Y coordinate position. Therefore, the loop of the current path of the upper and lower arm 11 can be reduced as indicated by the solid line arrow P in FIG. 10 in combination with a facing placement of the positive electrode terminal 305 and the negative electrode terminal 406. Therefore, the inductance can be reduced.

The configuration in which the protruding portion of the positive electrode terminal 305 and the protruding portion of the negative electrode terminal 406 are positioned between the sealing resin bodies 300 and 400 is not limited to the facing placement described above. In order not to face the positive terminal 305 and the negative terminal 406 in the Z-direction, a configuration may be adopted in which those positive and negative terminals 305 and 406 are offset from each other in the X-direction. In addition, the longitudinal portions 305b and 406b may be configured not to face each other in substantially the entire length but to face each other only partially.

Third Embodiment

The present embodiment can refer to the preceding embodiment. For that reason, descriptions of portions common to the semiconductor device 20 described in the preceding embodiment will be omitted.

Figure 11:
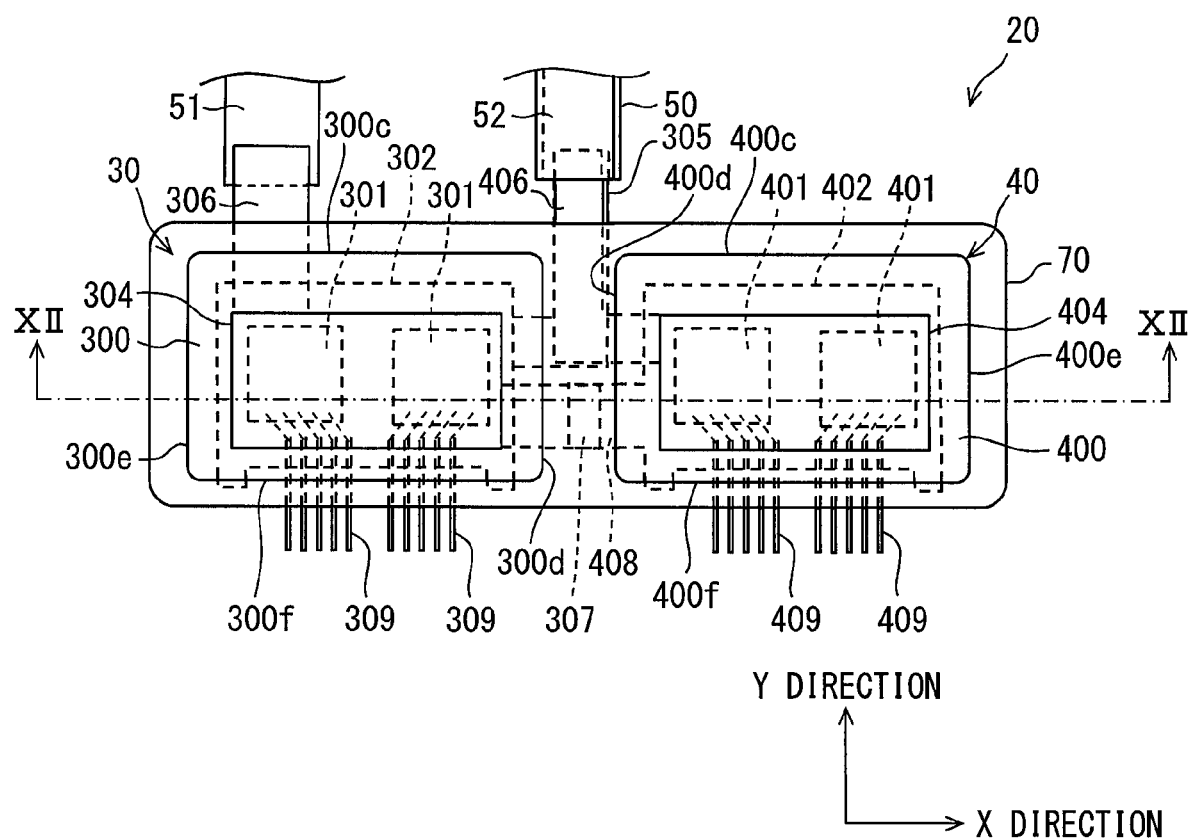
FIG. 11 is a plan view showing a schematic configuration of a semiconductor device according to a third embodiment.
Figure 12:
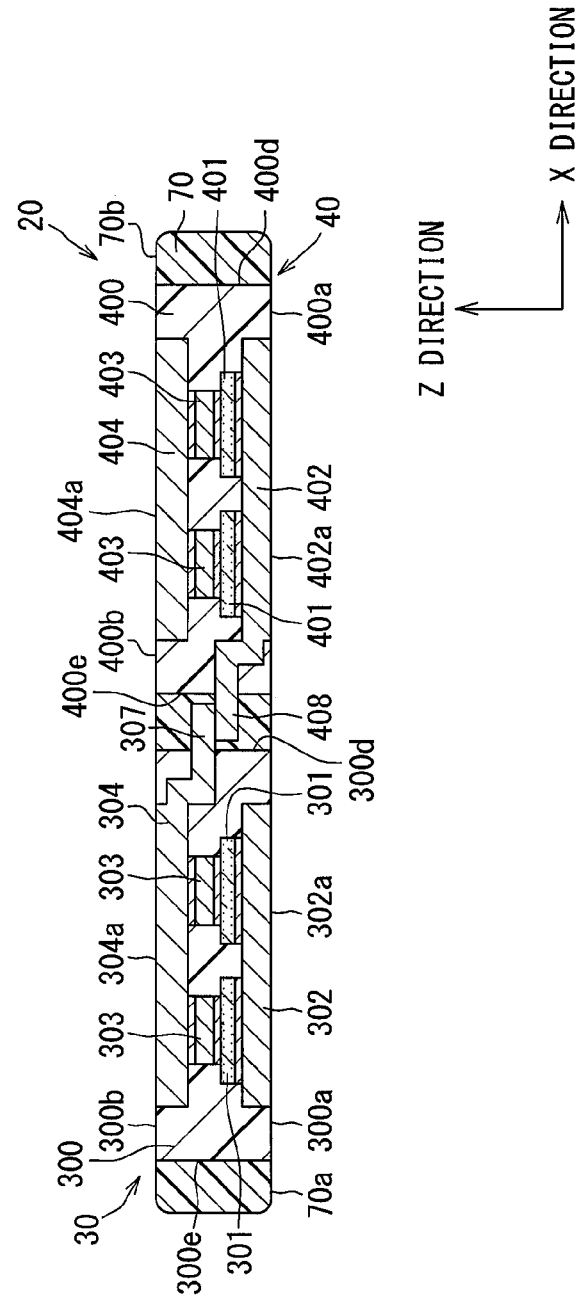
FIG. 12 is a cross-sectional view taken along a line XII-XII line of FIG. 11.

As shown in FIGS. 11 and 12, in the present embodiment, a semiconductor device 20 further includes a resin body 70 that integrally holds a first semiconductor module 30 and a second semiconductor module 40. The resin body 70 corresponds to a third resin body. The resin body 70 is, for example, a potting resin body formed by potting. The resin body 70 has one surface 70a and a back surface 70b opposite to the one surface 70a in the Z-direction.

In the present embodiment, the resin body 70 is provided such that the one surface 70a is substantially flush with one surfaces 300a and 400a of sealing resin bodies 300 and 400, and the back surface 70b is substantially flush with back surfaces 300b and 400b of the sealing resin bodies 300 and 400. Side surfaces 300c, 300d, 300e, and 300f of the sealing resin body 300 and side surfaces 400c, 400d, 400e, and 400f of the sealing resin body 400 are covered with the resin body 70. In other words, the resin body 70 is disposed in the entire facing region of the side surfaces 300d and 400e.

According to the above configuration, an insulating distance between the first semiconductor module 30 and the second semiconductor module 40 can be shortened by the placement of the resin body 70 as compared with the configuration in which the resin body 70 is not placed. This makes it possible to reduce the inductance. In addition, the resin body 70 can stabilize the connection structure of the two semiconductor modules 30 and 40.

Incidentally, a configuration in which the two semiconductor chips 301 configuring the upper arm 12 and the two semiconductor chips 401 configuring the lower arm 13 are integrally sealed with a sealing resin body is also conceivable. However, in a transfer molding method, since sealing is performed with compression (hardening shrinkage) of resin, if the body size becomes large as in the configuration in which the four semiconductor chips 301 and 401 configuring the upper and lower arm 11 are aligned in a line, the amount of deformation such as warpage increases. In addition, a resin flow time at the time of molding becomes necessary, and the possibility that unfilled or voids are generated increases. In other words, there is a fear that the insulation property is lowered and the reliability of the joint portion is lowered.

In contrast, according to the present embodiment, the two semiconductor chips 301 on the upper arm 12 side are sealed with the sealing resin body 300, and the two semiconductor chips 401 on the lower arm 13 side are sealed with the sealing resin body 400. In other words, the upper arm 12 and the lower arm 13 are individually primary-molded. As compared to the configuration in which the upper and lower arm 11 are integrally sealed, since the body size can be reduced, the occurrence of deformation, unfilling, or the like can be reduced. In addition, since secondary sealing is performed by potting after being molded individually, the large semiconductor device 20 that configures the upper and lower arm 11 can be obtained without compromising the original function of the resin body.

The sealing structure of the resin body 70 may be applied to the semiconductor device 20 shown in the first embodiment.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

Although the example in which the IGBTs 120, 130 and the FWDs 121, 131 are formed on the same chip have been described, the present disclosure can also be applied to a configuration in which those components are formed on different chips from each other.

The switching element is not limited to the IGBT. For example, an MOSFET may be employed.

The semiconductor device 20 illustrates an example having the terminals 303 and 403, but may not have the terminals 303 and 403. The terminals 303 may be common to the multiple semiconductor chips 301, and the terminals 403 may be common to the multiple semiconductor chips 401.

The heat radiation surfaces 302a, 304a, 302a, and 404a are exposed from the respective sealing resin bodies 300 and 400. However, the present disclosure is also applicable to a configuration in which the heat radiation surfaces 302a, 304a, 302a, and 404a are not exposed.

Figure 13:
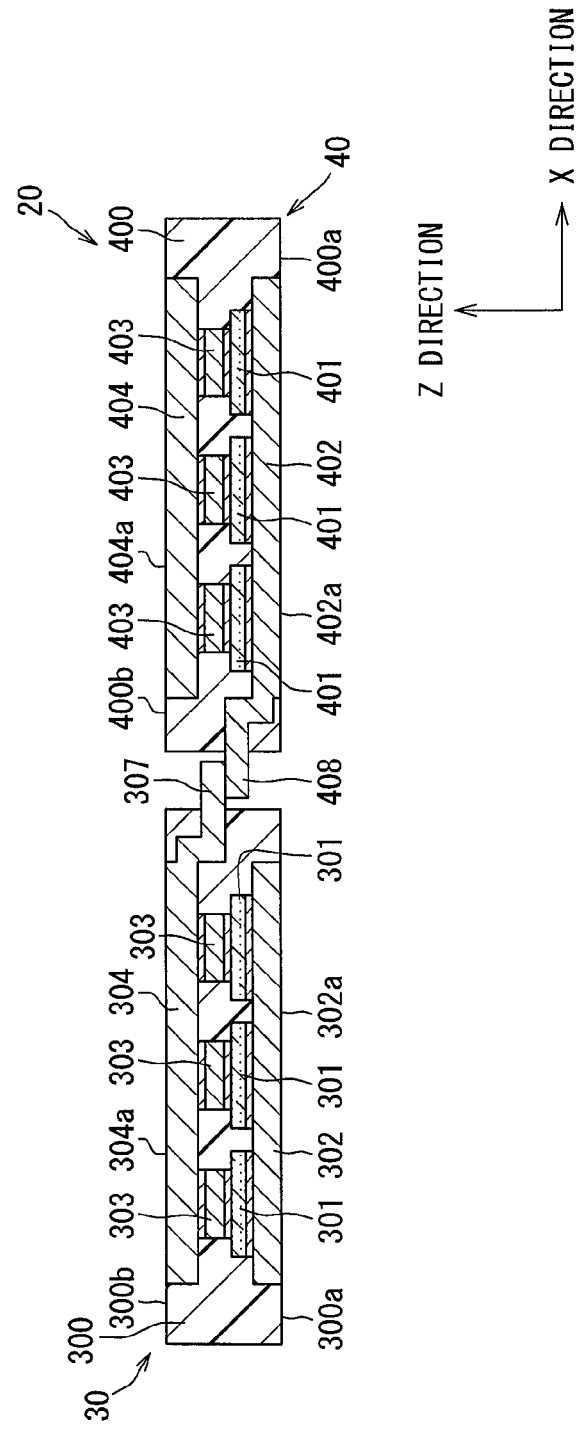
FIG. 13 is a cross-sectional view showing a third modification.

Although the example is shown in which the first semiconductor module 30 has the two semiconductor chips 301 and the second semiconductor module 40 has the two semiconductor chips 401, the number of semiconductor chips 301 and 401 connected in parallel is not limited to the above example. For example, as shown in a third modification of FIG. 13, a configuration can be employed in which three semiconductor chips 301 are connected in parallel on the upper arm side and three semiconductor chips are connected in parallel on the lower arm side. The number of semiconductor chips 301 may be different from the number of semiconductor chips 401.

Although the example in which the first semiconductor module 30 has the relay terminal 307, the second semiconductor module 40 has the relay terminal 408, and the relay terminals 307 and 408 are connected to each other has been described, the present disclosure is not limited to the above configuration. Only one of the two semiconductor modules 30 and 40 may have a relay terminal. For example, the first semiconductor module 30 may have the relay terminal 307, and the second semiconductor module 40 may not have the relay terminal 408. In that case, the relay terminal 307 is connected to the side surface of the heat sink 402 exposed from the side surface 400e, for example. Since the heat sink 402 is exposed from the side surface 400e, it is preferable to employ a sealing structure using the resin body 70.

Figure 14:
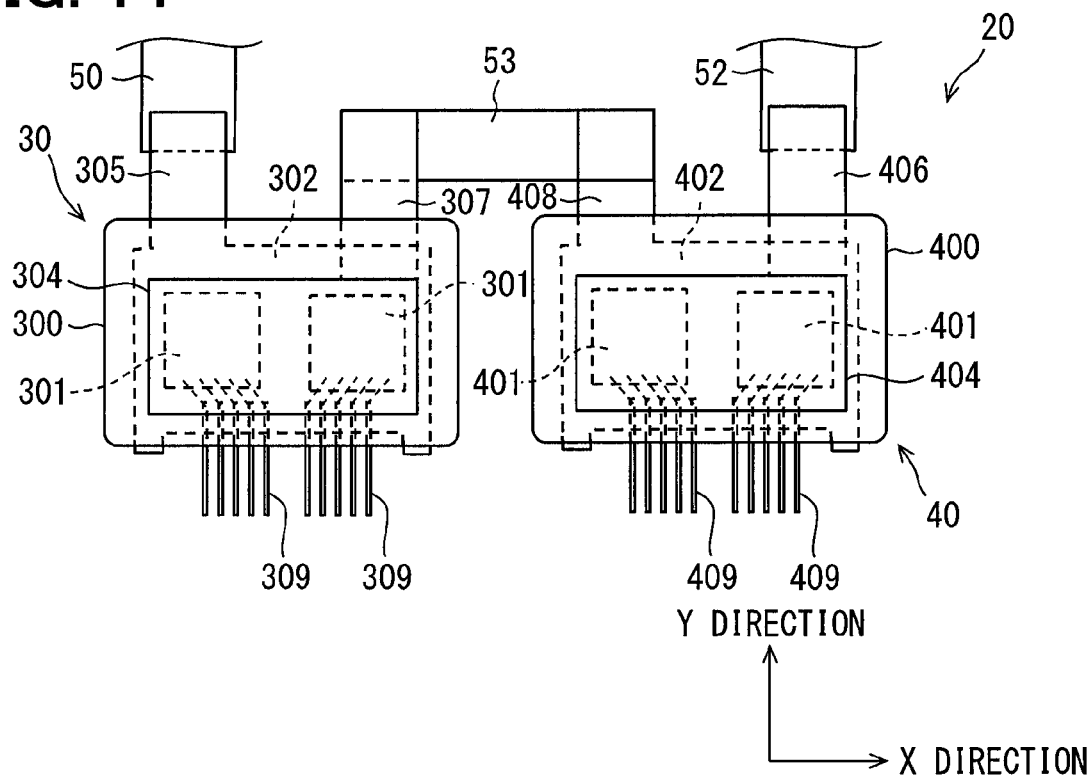
FIG. 14 is a plan view showing a fourth modification.

As shown in a fourth modification of FIG. 14, the relay terminals 307 and 408 may also serve as output terminals. In FIG. 14, the first semiconductor module 30 does not have the output terminal 306, and the second semiconductor module 40 does not have the dummy terminal 405. The relay terminal 307 extends from one end of the heat sink 304 in the Y-direction to the same side as the positive electrode terminal 305. A relay terminal 408 extends from one end of the heat sink 402 in the Y-direction to the same side as the negative electrode terminal 406. In the X-direction, the relay terminal 307 is provided closer to the second semiconductor module 40 than the positive electrode terminal 305, and the relay terminal 408 is provided closer to the first semiconductor module 30 than the negative electrode terminal 406. The relay terminals 307 and 408 are electrically connected through the bus bar 53 extending in the X-direction.

Figure 15:
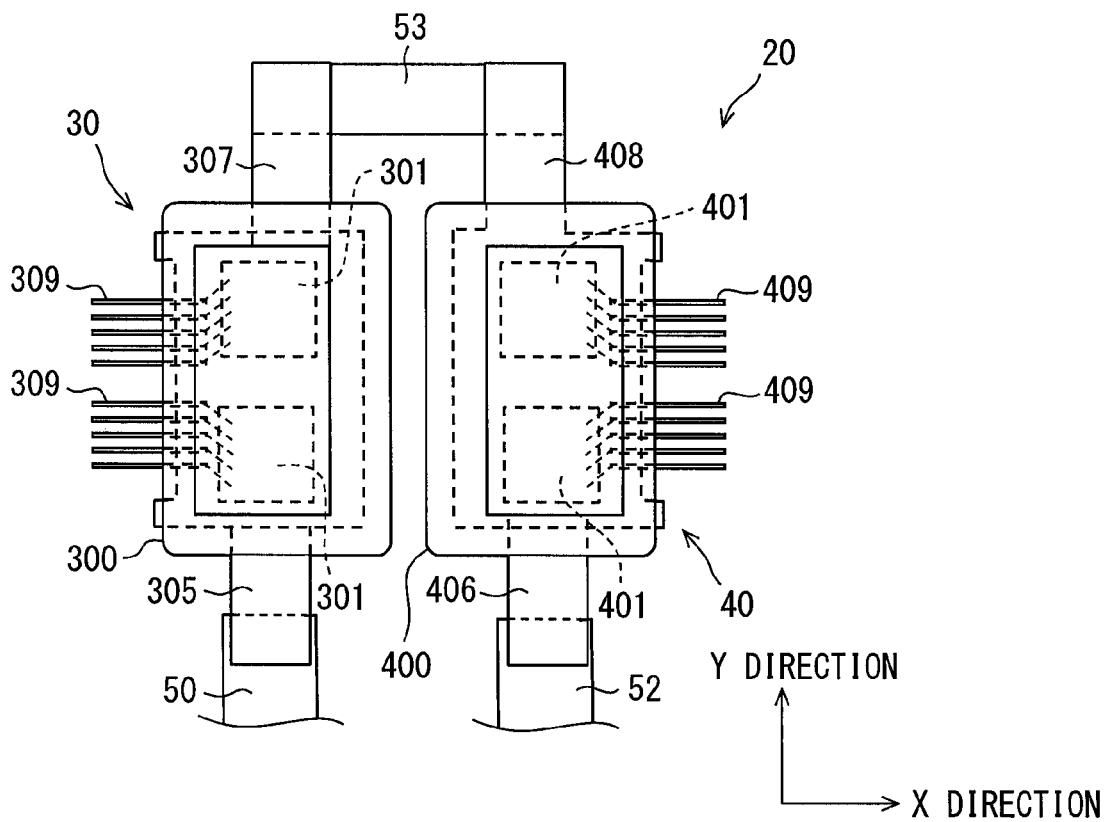
FIG. 15 is a plan view showing a fifth modification example.

As shown in a fifth modification of FIG. 15, an alignment direction of the two semiconductor modules 30 and 40 may be different from an alignment direction of the semiconductor chips 301 and 401. In FIG. 15, the two semiconductor modules 30 and 40 are aligned in the X-direction, while the multiple semiconductor chips 301 are aligned in the Y-direction. The multiple semiconductor chips 401 are also aligned side by side in the Y-direction. The positive electrode terminal 305 and the negative electrode terminal 406 protrude on the same side in the Y-direction and are adjacent to each other in the X-direction. The relay terminals 307 and 408 also serve as output terminals, and both protrude to the side opposite to the positive electrode terminal 305 and the negative electrode terminal 406. The signal terminal 309 protrudes on the opposite side to the second semiconductor module 40, and the signal terminal 409 also protrudes on the opposite side to the first semiconductor module 30.

Although an example in which the positive electrode terminal 305 and the negative electrode terminal 406 protrude on the same side in the Y-direction has been described, the present disclosure is not limited to the above example.

What is claimed is:

1. A semiconductor device which configures upper and lower arms, and is to be stacked on a cooler in a stacking direction so as to be cooled, the semiconductor device comprising:
   a first semiconductor module configuring the upper arm, the first semiconductor module including a plurality of first semiconductor elements connected in parallel to each other, a first resin body integrally sealing the plurality of first semiconductor elements, and a positive electrode terminal electrically connected to electrodes of the first semiconductor elements on a high potential side and protruding from the first resin body; and
   a second semiconductor module configuring the lower arm, the second semiconductor module including a plurality of second semiconductor elements connected in parallel to each other, a second resin body integrally sealing the plurality of first semiconductor elements, and a negative electrode terminal electrically connected to electrodes of the second semiconductor elements on a low potential side and protruding from the second resin body, and the second semiconductor module and the first semiconductor module being aligned in an alignment direction orthogonal to the stacking direction, wherein:
   the negative electrode terminal protrudes from one of side surfaces of the second resin body, on a same side as that of a side surface of the first resin body from which the positive electrode terminal protrudes,
   the first semiconductor module includes a first relay terminal which is electrically connected to electrodes of the first semiconductor elements on a low potential side, and protrudes from the first resin body,
   the second semiconductor module includes a second relay terminal which is electrically connected to electrodes of the second semiconductor elements on a high potential side, and protrudes from the second resin body,
   a portion of the first relay terminal protruding from the first resin body is connected to a portion of the second relay terminal protruding from the second resin body so as to provide a relay terminal that electrically relays the electrodes of the first semiconductor elements on the low potential side and the electrodes of the second semiconductor elements on the high potential side, the first relay terminal and the second relay terminal protrude from surfaces of the first resin body and the second resin body, respectively, the surfaces facing each other, the portion of the first relay terminal, which protrudes from the first resin body and the portion of the second relay terminal, which protrudes from the second resin body, are disposed in a facing region between the first resin body and the second resin body, the first semiconductor elements and the second semiconductor elements are disposed such that the electrodes of the first semiconductor elements on the high potential side and the electrodes of the second semiconductor elements on the high potential side are disposed on a same side in the stacking direction, the first semiconductor module includes a first dummy terminal that is electrically connected to the electrodes of the first semiconductor elements on the high potential side, and protrudes from a surface of the first resin body opposite to the first relay terminal, and the second semiconductor module includes a second dummy terminal that is electrically connected to the electrodes of the second semiconductor elements on the low potential side, and protrudes from a surface of the second resin body opposite to the second relay terminal.

2. The semiconductor device according to claim 1, wherein:

the first semiconductor module includes a low potential side terminal that is electrically connected to the electrodes of the first semiconductor elements on the low potential side, and protrudes from the same side surface of the first resin body from which the positive electrode terminal protrudes, the second semiconductor module includes a high potential side terminal that is electrically connected to the electrodes of the second semiconductor elements on the high potential side, and protrudes from the same side surface of the second resin body from which the negative electrode terminal protrudes, and one of the low potential side terminal and the high potential side terminal is provided as an output terminal, and the other of the low potential side terminal and the high potential side terminal is provided as a dummy terminal.

3. The semiconductor device according to claim 1, wherein:

the positive electrode terminal protrudes from a position closer to the second semiconductor module than a center of the first semiconductor module in the alignment direction of the first semiconductor module and the second semiconductor module, and the negative electrode terminal protrudes from a position closer to the first semiconductor module than a center of the second semiconductor module in the alignment direction.

4. The semiconductor device according to claim 1, wherein the negative electrode terminal is disposed adjacent to the positive electrode terminal in the alignment direction of the first semiconductor module and the second semiconductor module.

5. The semiconductor device according to claim 1, wherein the portion of the first relay terminal protruding from the first resin body and the portion of the second relay terminal protruding from the second resin body are located at a same position in a direction orthogonal to both of the alignment direction of the first semiconductor module and the second semiconductor module and the stacking direction.

6. The semiconductor device according to claim 1, further comprising a third resin body that integrally holds the first semiconductor module and the second semiconductor module.

* * * * *